United States Patent
Ogura et al.

(10) Patent No.: US 11,916,538 B2
(45) Date of Patent: Feb. 27, 2024

(54) VIBRATOR DEVICE

(71) Applicant: SEIKO EPSON CORPORATION, Tokyo (JP)

(72) Inventors: Seiichiro Ogura, Nagano-ken (JP); Keiichi Yamaguchi, Ina (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 340 days.

(21) Appl. No.: 17/152,128

(22) Filed: Jan. 19, 2021

(65) Prior Publication Data
US 2021/0226606 A1    Jul. 22, 2021

(30) Foreign Application Priority Data

Jan. 20, 2020 (JP) .................... 2020-006667

(51) Int. Cl.
| H03H 9/19 | (2006.01) |
| H03H 9/10 | (2006.01) |
| H03H 9/05 | (2006.01) |

(52) U.S. Cl.
CPC .......... *H03H 9/19* (2013.01); *H03H 9/0509* (2013.01); *H03H 9/1021* (2013.01)

(58) Field of Classification Search
CPC ....... H03H 9/19; H03H 9/0509; H03H 9/1021
See application file for complete search history.

(56) References Cited

U.S. PATENT DOCUMENTS

| 4,786,837 | A | * | 11/1988 | Kalnin | .................. B06B 1/0688 310/365 |
| 2007/0229177 | A1 | | 10/2007 | Moriya | |
| 2008/0209703 | A1 | * | 9/2008 | Iwai | .......................... C23F 1/26 29/25.35 |
| 2008/0265717 | A1 | * | 10/2008 | Iizuka | .................. H03H 9/1021 310/348 |
| 2018/0091066 | A1 | * | 3/2018 | Ichimura | ............... H03H 9/1014 |
| 2018/0274922 | A1 | | 9/2018 | Nishizawa et al. | |
| 2023/0049031 | A1 | * | 2/2023 | Pibre | .................... H10N 30/857 |

FOREIGN PATENT DOCUMENTS

| EP | 0092515 A1 | * | 10/1983 |
| JP | 2000-134058 A | | 5/2000 |
| JP | 2002-335142 A | | 11/2002 |
| JP | 2006-174370 | | 6/2006 |
| JP | 2007-251787 A | | 9/2007 |

(Continued)

*Primary Examiner* — J. San Martin
(74) *Attorney, Agent, or Firm* — Rankin, Hill & Clark LLP (57) ABSTRACT

A vibrator device includes a vibrating body having obverse and reverse principal surfaces and a side surface connecting the obverse and reverse principal surfaces to each other, a package configured to house the vibrating body, and a bonding material configured to fix the vibrating body to the package, wherein the vibrating body has a coupling part including a recess recessed from the side surface toward a center of the principal surfaces, and a protrusion protruding from a side surface of the recess, the protrusion is one of breaking-off parts with which a plurality of the vibrating bodies is broken off from a wafer to which the plurality of the vibrating bodies is coupled, and the bonding material has contact with a side surface of the protrusion in the recess.

17 Claims, 12 Drawing Sheets

(56) References Cited

FOREIGN PATENT DOCUMENTS

| | | | |
|---|---|---|---|
| JP | 2009-152988 A | | 7/2009 |
| JP | 2010-11352 A | | 1/2010 |
| JP | 2012161104 A | * | 8/2012 |
| JP | 2013-110658 | | 6/2013 |
| JP | 2013-207527 | | 10/2013 |
| JP | 2018-006810 | | 1/2018 |
| JP | 2018-159674 | | 10/2018 |
| KR | 20160012784 A | * | 2/2016 |

* cited by examiner

VIBRATOR DEVICE

The present application is based on, and claims priority from JP Application Serial Number 2020-006667, filed Jan. 20, 2020, the disclosure of which is hereby incorporated by reference herein in its entirety.

BACKGROUND

1. Technical Field

The present disclosure relates to a vibrator device.

2. Related Art

A quartz crystal device having a quartz crystal element which is provided with exciting electrodes formed on both principal surfaces, and is installed in a package is stable in frequency-temperature characteristic, and is therefore used for an oscillator such as a temperature compensated crystal oscillator (TCXO) as a reference frequency source for outputting a frequency signal.

In, for example, JP-A-2018-6810 (Document 1), there is disclosed a quartz crystal device in which penetration parts are disposed along a peripheral edge of one side of a quartz crystal element, extraction electrodes are formed in a portion including the penetration parts, and an electrically-conductive adhesive is made to enter the penetration parts to thereby increase the junction area between the electrically-conductive adhesive and the extraction electrodes, and thus, the bonding strength between the quartz crystal element and the electrically-conductive adhesive is increased.

However, the quartz crystal element of the quartz crystal device described in Document 1 is formed by being broken off from a wafer in which a plurality of quartz crystal elements are formed, and a breaking-off part with which the quartz crystal element is coupled to the wafer is disposed at a position different from the penetration parts in the peripheral edge of the one side where the penetration parts are disposed of the quartz crystal element, and at an outer side than the penetration parts. Therefore, it is necessary to ensure both of a space for the penetration parts and a space for the breaking-off part, and there is a problem that it is difficult to reduce the size of the quartz crystal element.

SUMMARY

A vibrator device includes a vibrating body having obverse and reverse principal surfaces and a side surface connecting the obverse and reverse principal surfaces to each other, a package configured to house the vibrating body, and a bonding material configured to fix the vibrating body to the package, wherein the vibrating body has a coupling part including a recess recessed from the side surface toward a center of the principal surfaces, and a protrusion protruding from a side surface of the recess, the protrusion is one of breaking-off parts with which a plurality of the vibrating bodies is broken off from a wafer to which the plurality of the vibrating bodies is coupled, and the bonding material has contact with a side surface of the protrusion in the recess.

DESCRIPTION OF EXEMPLARY EMBODIMENTS

1. First Embodiment

First, a vibrator device 1 according to a first embodiment will be described with reference to FIG. 1, FIG. 2, FIG. 3, FIG. 4, and FIG. 5.

It should be noted that an X axis, a Y axis, and a Z axis in the drawings are axes perpendicular to each other, wherein a direction extending along the X axis is defined as an "X direction," a direction extending along the Y axis is defined as a "Y direction," and a direction extending along the Z axis is defined as a "Z direction," and directions with arrows are positive directions. Further, the description will be presented defining the positive direction in the Z direction as an "upper side" or an "obverse side," and the negative direction in the Z direction as a "lower side" or a "reverse side." Further, in FIG. 1, a plan view seen through a lid 33 is used for the sake of convenience of explanation.

Figure 1:
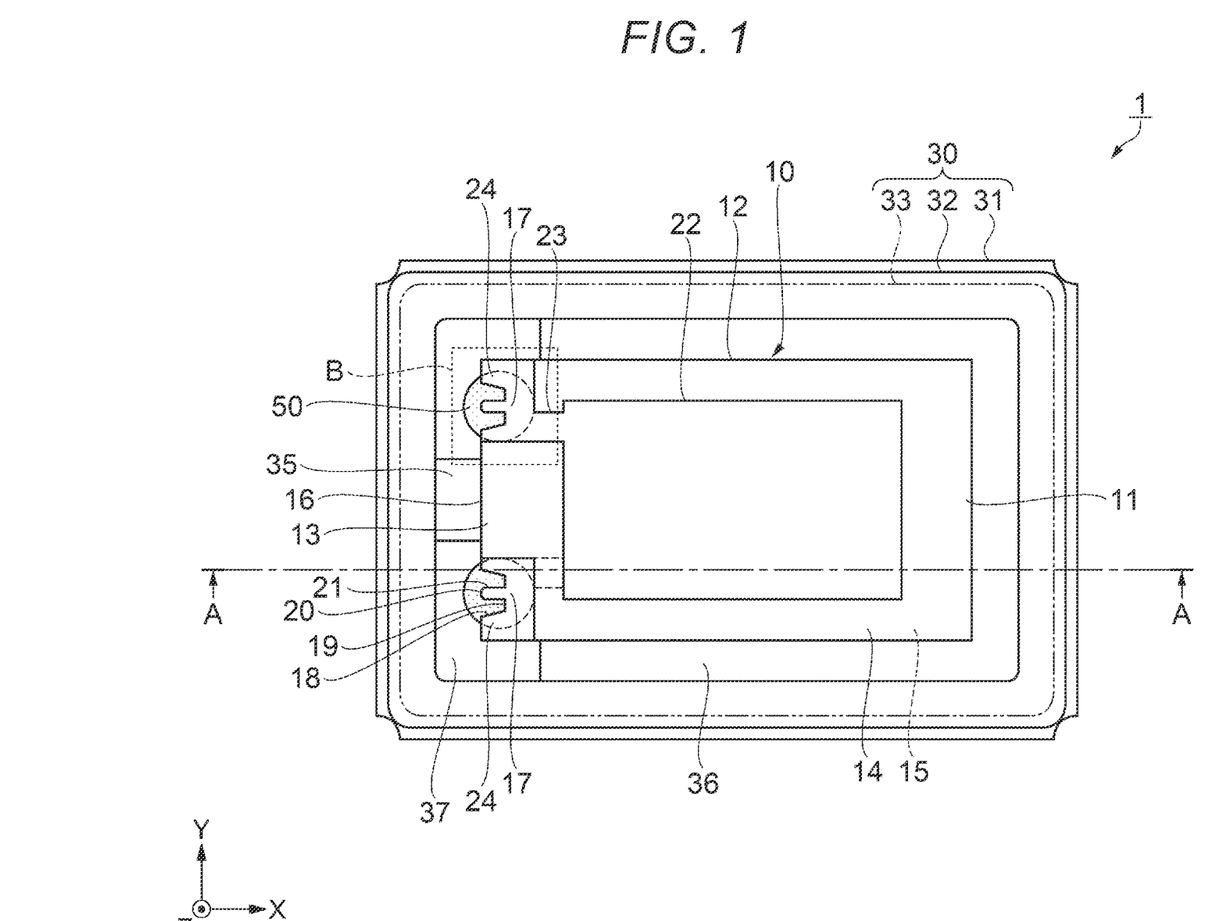
FIG. 1 is a plan view showing a schematic configuration of a vibrator device according to a first embodiment.
Figure 2:
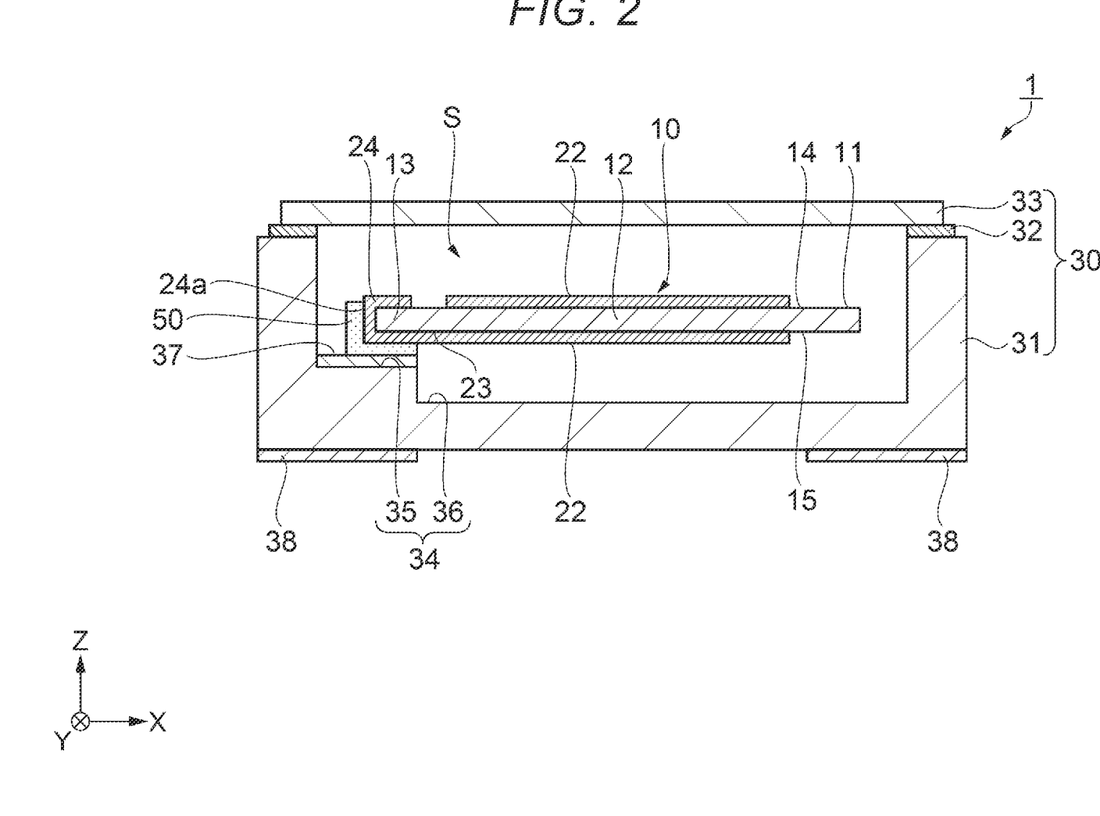
FIG. 2 is a cross-sectional view along a line A-A shown in FIG. 1.

As shown in FIG. 1 and FIG. 2, the vibrator device 1 according to the present embodiment has a package 30 and a vibrating body 10 housed in the package 30.

The package 30 has a base 31 provided with a recessed part 34 opening in an upper surface, and a lid 33 which is bonded to the upper surface of the base 31 via a bonding member 32 so as to close the opening of the recessed part 34. The recessed part 34 forms an internal space S inside the package 30, and the vibrating body 10 is housed in the internal space S. For example, the base 31 can be formed of ceramics such as alumina, and the lid 33 can be formed of a metal material such as kovar. It should be noted that the constituent materials of the base 31 and the lid 33 are not particularly limited.

The internal space S is airtightly sealed, and is set in an atmospheric pressure state filled with an inert gas such as nitrogen. Thus, it is possible to stabilize the vibration characteristics of the vibrating body 10 for a long period of time. It should be noted that the atmosphere in the internal space S is not particularly limited, but can also be, for example, in a reduced-pressure state or a state approximate to a vacuum state.

Further, the recessed part 34 is constituted by two recessed parts 35, 36 disposed side by side in the Z direction, and has the recessed part 35 opening in the upper surface of the base 31, and the recessed part 36 which opens in a bottom surface of the recessed part 35, and is smaller in opening width than the recessed part 35. Further, the vibrating body 10 is fixed to the bottom surface of the recessed part 35.

Further, the bottom surface of the recessed part 35 is provided with a plurality of internal terminals 37, and the lower surface of the base 31 is provided with a plurality of external terminals 38. The internal terminals 37 and the external terminals 38 are electrically coupled to each other via interconnections not shown formed inside the base 31. Further, the internal terminals 37 are each electrically coupled to the vibrating body 10 via a bonding material 50 having electrical conductivity.

The vibrating body 10 is a vibrator element 11 having a rectangular shape provided with a vibrating part 12 and a fixation part 13, and has obverse and reverse principal surfaces 14, 15 and side surfaces 16 connecting the obverse and reverse principal surfaces 14, 15 to each other, and is formed of an AT-cut quartz crystal substrate or the like. Further, the obverse and reverse principal surfaces 14, 15 of the vibrating part 12 located at the center of the vibrator element 11 are each provided with an excitation electrode 22 for driving the vibrator element 11, and the obverse and reverse principal surfaces 14, 15 of the fixation part 13 located at an end part in the negative X direction of the vibrator element 11 are provided with pad electrodes 24 as electrodes. The excitation electrode 22 and the pad electrode 24 provided to the obverse principal surface 14 are electrically coupled to each other with a lead electrode 23, and the excitation electrode 22 and the pad electrode 24 provided to the reverse principal surface 15 are electrically coupled to each other with a lead electrode 23. Further, the pad electrode 24 provided to the obverse principal surface 14 and the pad electrode 24 provided to the reverse principal surface 15 are electrically coupled to each other with a coupling electrode 24a as apart of the pad electrode 24 provided to the side surface 16. Therefore, the pad electrodes 24 provided to the obverse and reverse principal surfaces 14, 15 in each of coupling parts 17 are electrically coupled to an interconnection not shown provided to the package 30 via the bonding material 50. It should be noted that the pad electrodes 24 are provided to the obverse and reverse principal surfaces 14, 15 in each of the coupling parts 17 in the present embodiment, but the pad electrode 24 to be coupled to the excitation electrode 22 provided to the reverse principal surface 15 can be provided only to the reverse principal surface 15.

Figure 3:
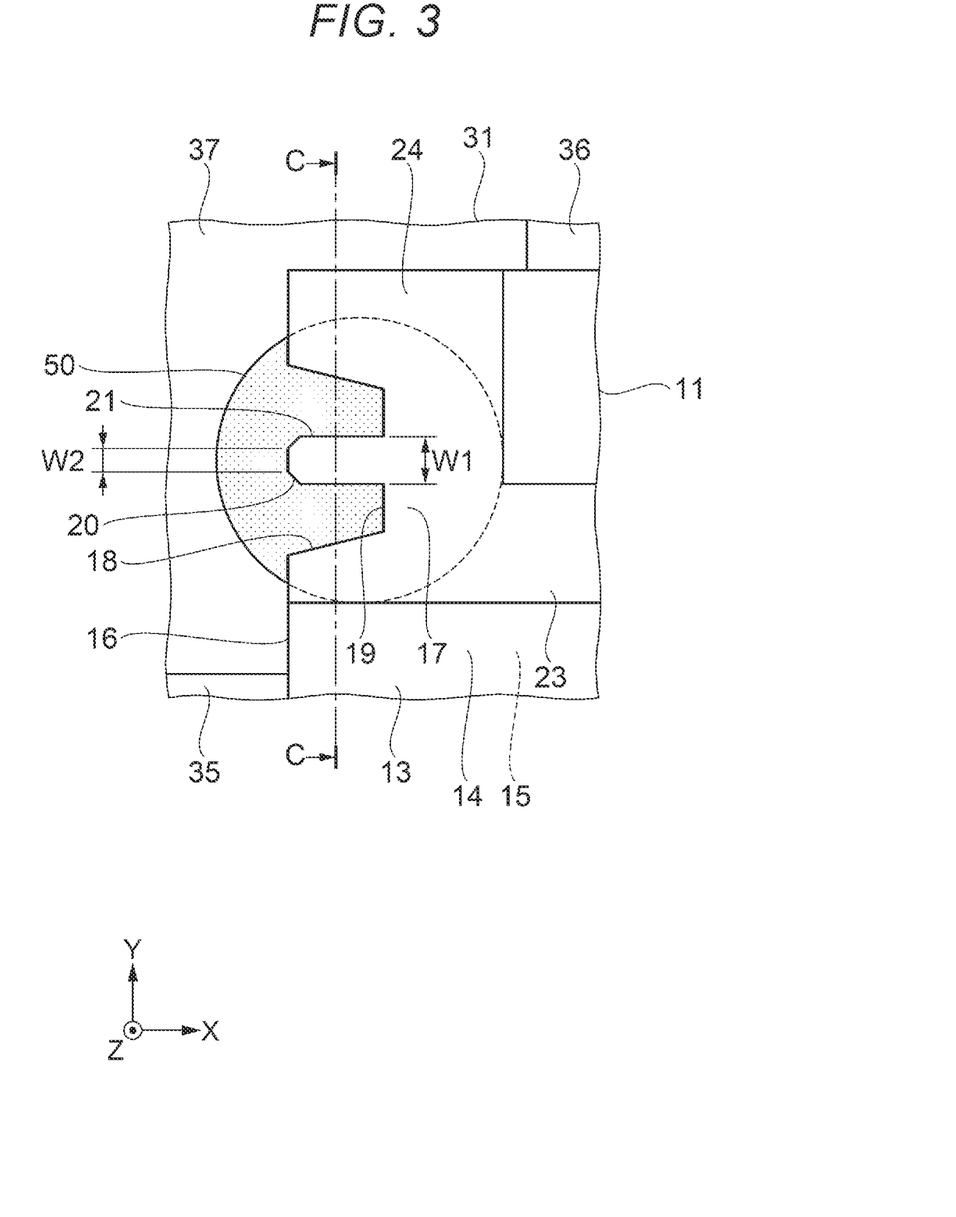
FIG. 3 is an enlarged view of a part B shown in FIG. 1.

In the vibrating body 10, the fixation part 13 is provided with the first coupling part 17 and the second coupling part 17 as coupling parts disposed along the Y direction, wherein the coupling parts each include a recess 18 recessed from the side surface 16 located on the fixation part 13 side toward the center of the principal surfaces 14, 15, and a protrusion 20 protruding from a side surface 19 close to the center of the principal surfaces 14, 15 in the recess 18, and are each provided with the pad electrodes 24. Further, each of the protrusions 20 provided to the two coupling parts 17 protrudes toward the X direction as a first direction which is a long-side direction of the vibrator element 11. It should be noted that although in the present embodiment, there are disposed two coupling parts 17 each having the protrusion 20, this is not a limitation, and it is possible to dispose more than two coupling parts 17.

Figure 5:
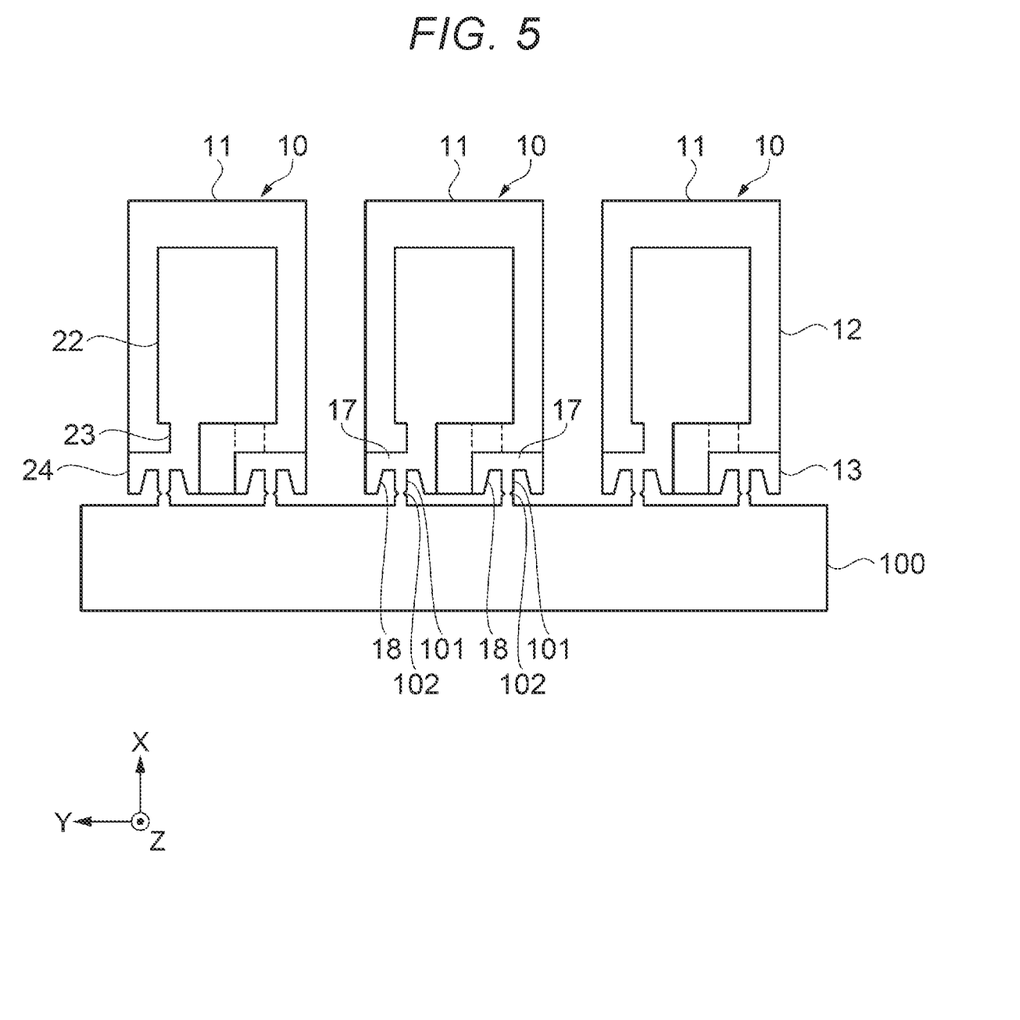
FIG. 5 is a plan view showing a part of a wafer in the state in which a plurality of vibrating bodies is formed.

As shown in FIG. 3, in the protrusion 20, the tip end of the protrusion is made thinner than the base end close to the side surface 19 of the recess 18. In other words, the length W2 in the Y direction of the tip of the protrusion 20 is shorter than the length W1 in the Y direction of the base end of the protrusion 20. This is because grooves 102 are provided to each of breaking-off parts 101 which couple a plurality of vibrating bodies 10 and a wafer 100 to each other as shown in FIG. 5, and the vibrating bodies 10 are made easy to be broken off from the wafer 100. Therefore, the protrusions 20 correspond to the breaking-off parts 101 with which the plurality of vibrating bodies 10 is broken off from the wafer 100 to which the plurality of vibrating bodies 10 is coupled. Further, since the protrusion 20 forming the breaking-off part 101 is provided to the recess 18, it is possible to reduce the length in the Y direction of the vibrating body 10, and thus, it is possible to achieve reduction in size of the vibrating body 10.

Figure 4:
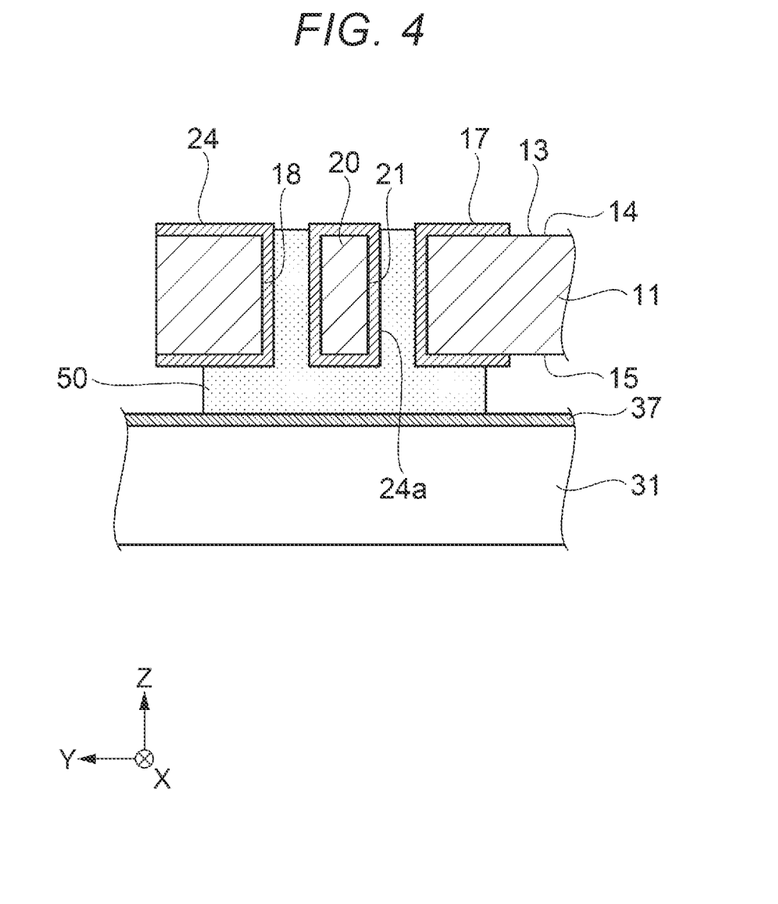
FIG. 4 is a cross-sectional view along a line C-C in FIG. 3.

As shown in FIG. 4, the coupling part 17 provided with the pad electrodes 24 is provided with the coupling electrode 24a formed on a side surface 21 of the protrusion 20, and is fixed onto the internal terminal 37 provided to the base 31 with the bonding material 50 having electrical conductivity. Further, the bonding material 50 has contact with the side surface 21 of the protrusion 20 inside the recess 18 via the coupling electrode 24a. In other words, the bonding material 50 penetrates between the recess 18 and the protrusion 20. Therefore, since the protrusion 20 is disposed inside the recess 18 in the coupling part 17, it is possible to increase the contact area between the reverse principal surface 15 or the side surface 21 of the protrusion 20 and the bonding material 50 compared to when the recess 18 is disposed alone, and it is possible to more firmly fix the vibrating body 10 inside the package 30. It should be noted that the bonding material 50 is not particularly limited as long as both of the electrical conductivity and the bonding property are provided, and it is possible to use, for example, an electrically-conductive adhesive having an electrically conductive filler such as a silver filler dispersed in a variety of adhesives such as a polyimide type adhesive, an epoxy type adhesive, a silicone type adhesive, or an acrylic adhesive. Further, although the coupling electrode 24a is provided to the side surface of the protrusion 20 in the present embodiment, this is not a limitation, and it is possible to adopt a configuration in which the bonding material 50 has direct contact with the side surface of the protrusion 20 without forming the coupling electrode 24a.

In the vibrator device 1 according to the present embodiment, the protrusions 20 forming the breaking-off parts 101 with which the vibrating body 10 to be housed in the package 30 is broken off from the wafer 100 to which the plurality of vibrating bodies 10 is coupled are each provided to the recess 18. Therefore, it is possible to reduce the length in the Y direction of the vibrating body 10, and it is possible to achieve the reduction in size of the vibrator device 1. Further, since the bonding material 50 for fixing the vibrating body 10 inside the package 30 has contact with the side surface 21 of the protrusion 20 inside the recess 18, it is possible to increase the contact area between the bonding material 50 and the coupling part 17, and thus, it is possible to more firmly fix the vibrating body 10.

Further, since the tip side of the protrusion is made thinner than the base end closer to the side surface 19 of the recess 18 in the protrusion 20, it is easy to break off the vibrating body 10 from the wafer to which the plurality of vibrating body 10 is coupled.

Further, since the coupling parts 17 each have the pad electrodes 24 on at least one of the principal surfaces 14, 15, and the pad electrodes 24 is electrically coupled to the interconnections at the package 30 side via the bonding material 50, it is possible to energize the vibrating body 10 from the outside of the package 30 to thereby excite the vibrating body 10.

Further, since the coupling electrode 24a to be a part of the pad electrode 24 is also provided to the side surface 21 of the protrusion 20, it is possible to further reduce the broken line between the excitation electrode 22 and the interconnection of the package 30.

Further, since the vibrating body 10 includes two or more coupling parts 17, it is possible to conduct two currents, namely positive and negative currents, to the excitation electrodes 22 of the vibrating body 10, and thus, it is possible to excite the vibrating body 10.

Further, since the protrusion 20 protrudes toward the X direction in each of the two or more coupling parts 17, it is possible to reduce the length in the Y direction of the vibrating body 10, and thus, it is possible to achieve reduction in size of the vibrating body 10.

2. Second Embodiment

Then, a vibrator device 1a according to a second embodiment will be described with reference to FIG. 6. It should be noted that in FIG. 6, electrodes provided to principal surfaces 14a, 15a and a side surface 16a are omitted from the illustration.

Compared to the vibrator device 1 according to the first embodiment, the vibrator device 1a according to the present embodiment is substantially the same as the vibrator device 1 according to the first embodiment except the fact that a structure of a vibrating body 10a is different. It should be noted that the description will be presented with a focus on the difference from the first embodiment described above, and the description of substantially the same issues will be omitted.

Figure 6:
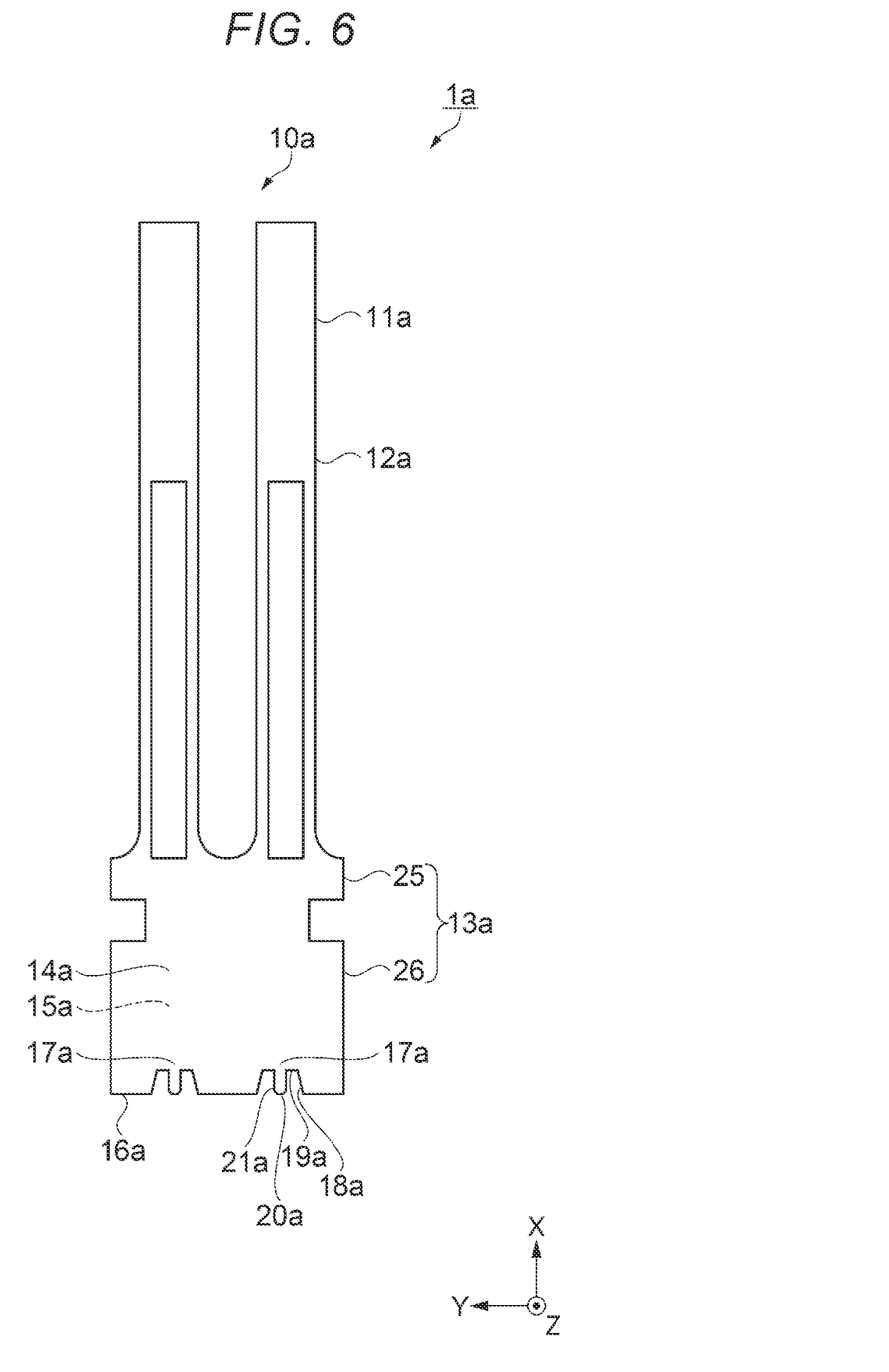
FIG. 6 is a plan view showing a configuration of a vibrating body of a vibrator device according to a second embodiment.

As shown in FIG. 6, the vibrating body 10a of the vibrator device 1a is a vibrator element 11a shaped like a tuning fork provided with a vibrating part 12a and a fixation part 13a having a base part 25 coupled to the vibrating part 12a, and a support part 26 coupled to the base part 25, and has the obverse and reverse principal surfaces 14a, 15a and the side surface 16a connecting the obverse and reverse principal surfaces 14a, 15a to each other, and is formed of a Z-cut quartz crystal substrate or the like.

In the vibrating body 10a, the support part 26 is provided with two coupling parts 17a arranged along the Y direction, wherein the coupling parts 17a each include a recess 18a recessed from the side surface 16a close to the fixation part 13a toward the vibrating part 12a, and a protrusion 20a protruding from a side surface 19a close to the vibrating part 12a in the recess 18a toward the negative X direction. Further, each of the protrusions 20 provided to the two coupling parts 17a protrudes toward the X direction as a longitudinal direction of the vibrator element 11a.

By adopting such a configuration to fix the coupling parts 17a inside the package 30 with the bonding material 50, there can be obtained substantially the same advantages as those of the vibrator device 1 according to the first embodiment.

3. Third Embodiment

Then, a vibrator device 1b according to a third embodiment will be described with reference to FIG. 7. It should be noted that in FIG. 7, electrodes provided to principal surfaces 14b, 15b and a side surface 16b are omitted from the illustration.

Compared to the vibrator device 1 according to the first embodiment, the vibrator device 1b according to the present embodiment is substantially the same as the vibrator device 1 according to the first embodiment except the fact that a structure of a vibrating body 10b is different. It should be noted that the description will be presented with a focus on the difference from the first embodiment described above, and the description of substantially the same issues will be omitted.

Figure 7:
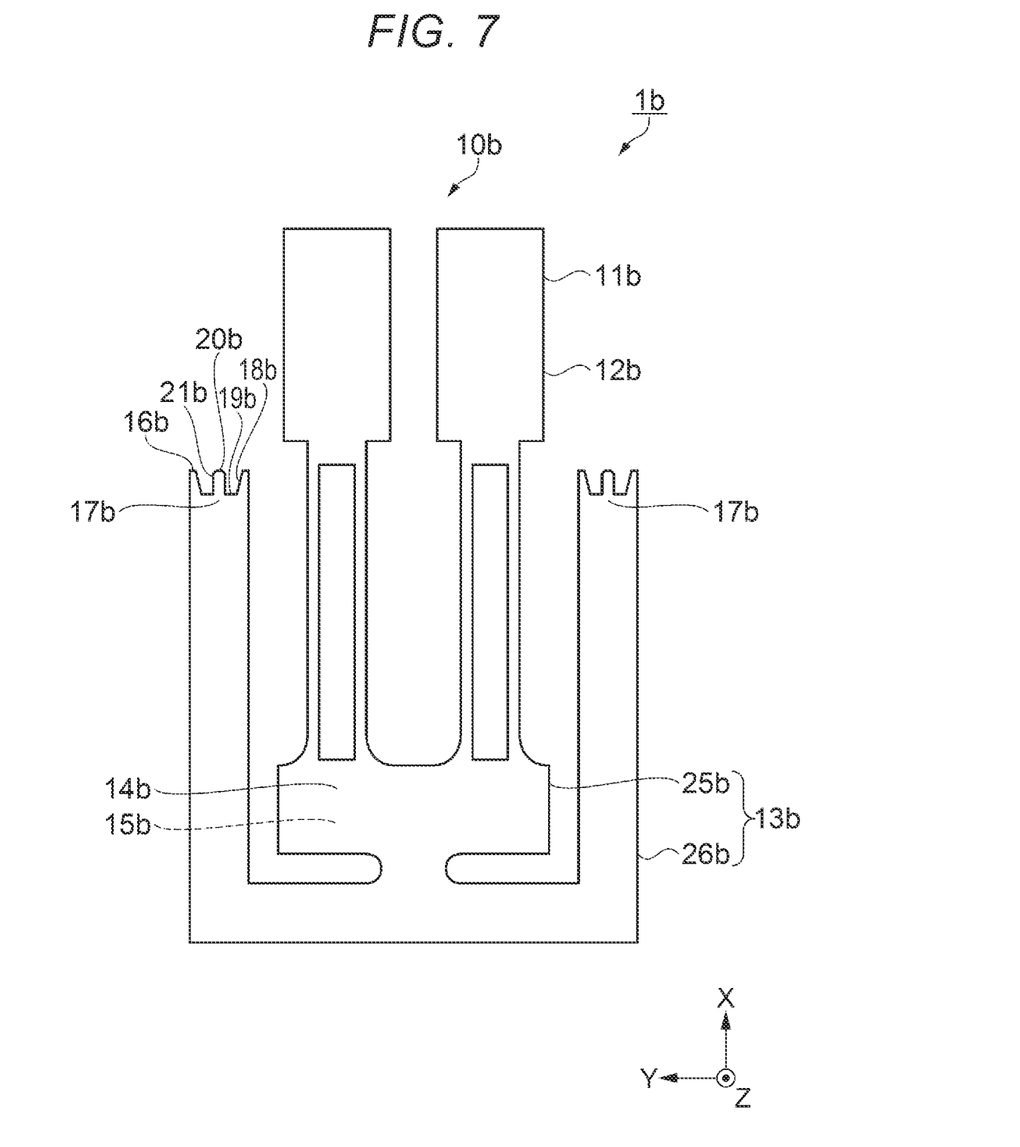
FIG. 7 is a plan view showing a configuration of a vibrating body of a vibrator device according to a third embodiment.

As shown in FIG. 7, the vibrating body 10b of the vibrator device 1b is a vibrator element 11b shaped like a tuning fork provided with a vibrating part 12b and a fixation part 13b having a base part 25b coupled to the vibrating part 12b, and two support parts 26b coupled to the base part 25b, and has the obverse and reverse principal surfaces 14b, 15b and the side surface 16b connecting the obverse and reverse principal surfaces 14b, 15b to each other, and is formed of a Z-cut quartz crystal substrate or the like.

In the vibrating body 10b, the coupling part 17b is disposed in a tip part at an opposite side to the base part 25b in each of the two support parts 26b. The coupling parts 17b each include a recess 18b recessed toward the negative X direction, and a protrusion 20b protruding toward the positive X direction from a side surface 19b at the negative X direction side in the recess 18b.

By adopting such a configuration to fix the coupling parts 17b inside the package 30 with the bonding material 50, there can be obtained substantially the same advantages as those of the vibrator device 1 according to the first embodiment.

4. Fourth Embodiment

Then, a vibrator device 1c according to a fourth embodiment will be described with reference to FIG. 8. It should be noted that in FIG. 8, electrodes provided to principal surfaces 14c, 15c and a side surface 16c are omitted from the illustration.

Compared to the vibrator device 1 according to the first embodiment, the vibrator device 1c according to the present embodiment is substantially the same as the vibrator device 1 according to the first embodiment except the fact that a structure of a vibrating body 10c is different. It should be noted that the description will be presented with a focus on the difference from the first embodiment described above, and the description of substantially the same issues will be omitted.

Figure 8:
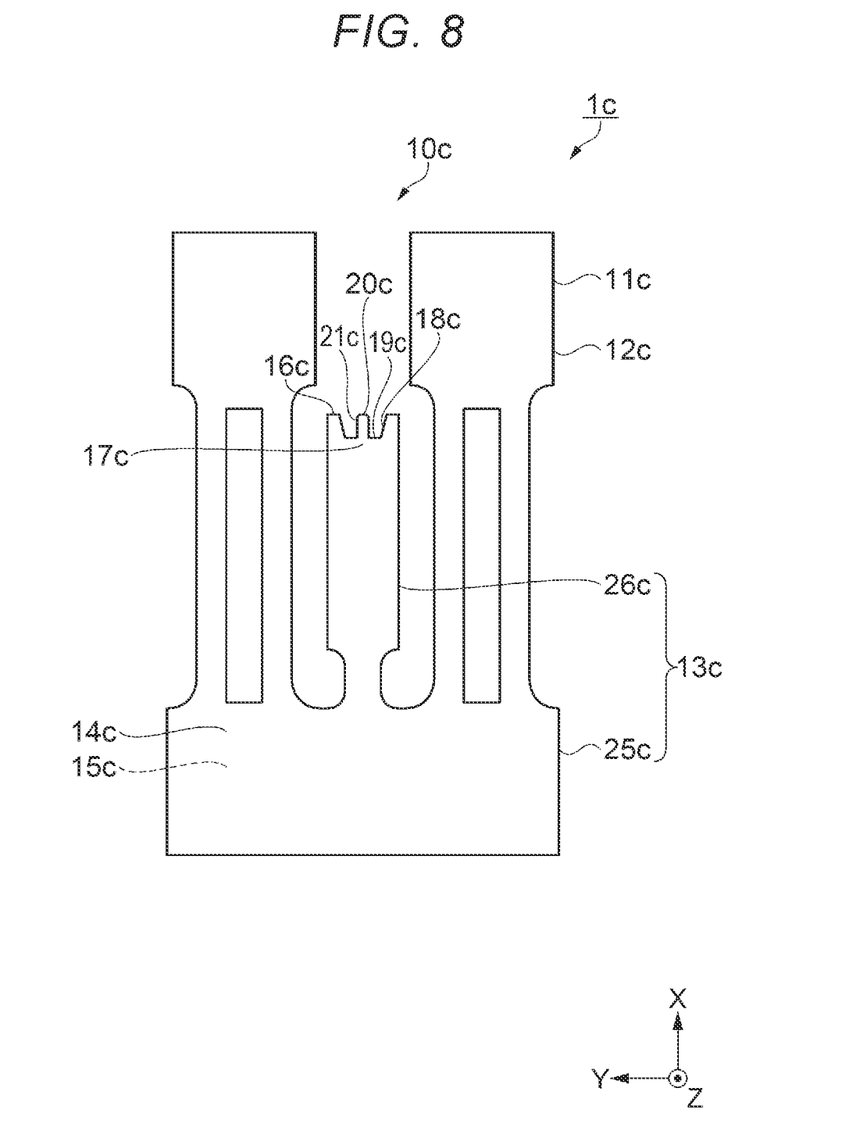
FIG. 8 is a plan view showing a configuration of a vibrating body of a vibrator device according to a fourth embodiment.

As shown in FIG. 8, the vibrating body 10c of the vibrator device 1c is a vibrator element 11c shaped like a tuning fork provided with a vibrating part 12c and a fixation part 13c having a base part 25c coupled to the vibrating part 12c, and a support part 26c coupled to the base part 25c, and extending toward the vibrating part 12c, and has the obverse and reverse principal surfaces 14c, 15c and the side surface 16c connecting the obverse and reverse principal surfaces 14c, 15c to each other, and is formed of a Z-cut quartz crystal substrate or the like.

In the vibrating body 10c, the coupling part 17c is disposed in a tip part at an opposite side to the base part 25c in the support part 26c. The coupling part 17c includes a recess 18c recessed toward the negative X direction, and a protrusion 20c protruding toward the positive X direction from a side surface 19c at the negative X direction side in the recess 18c.

By adopting such a configuration to fix the coupling part 17c inside the package 30 with the bonding material 50, there can be obtained substantially the same advantages as those of the vibrator device 1 according to the first embodiment.

5. Fifth Embodiment

Figure 9:
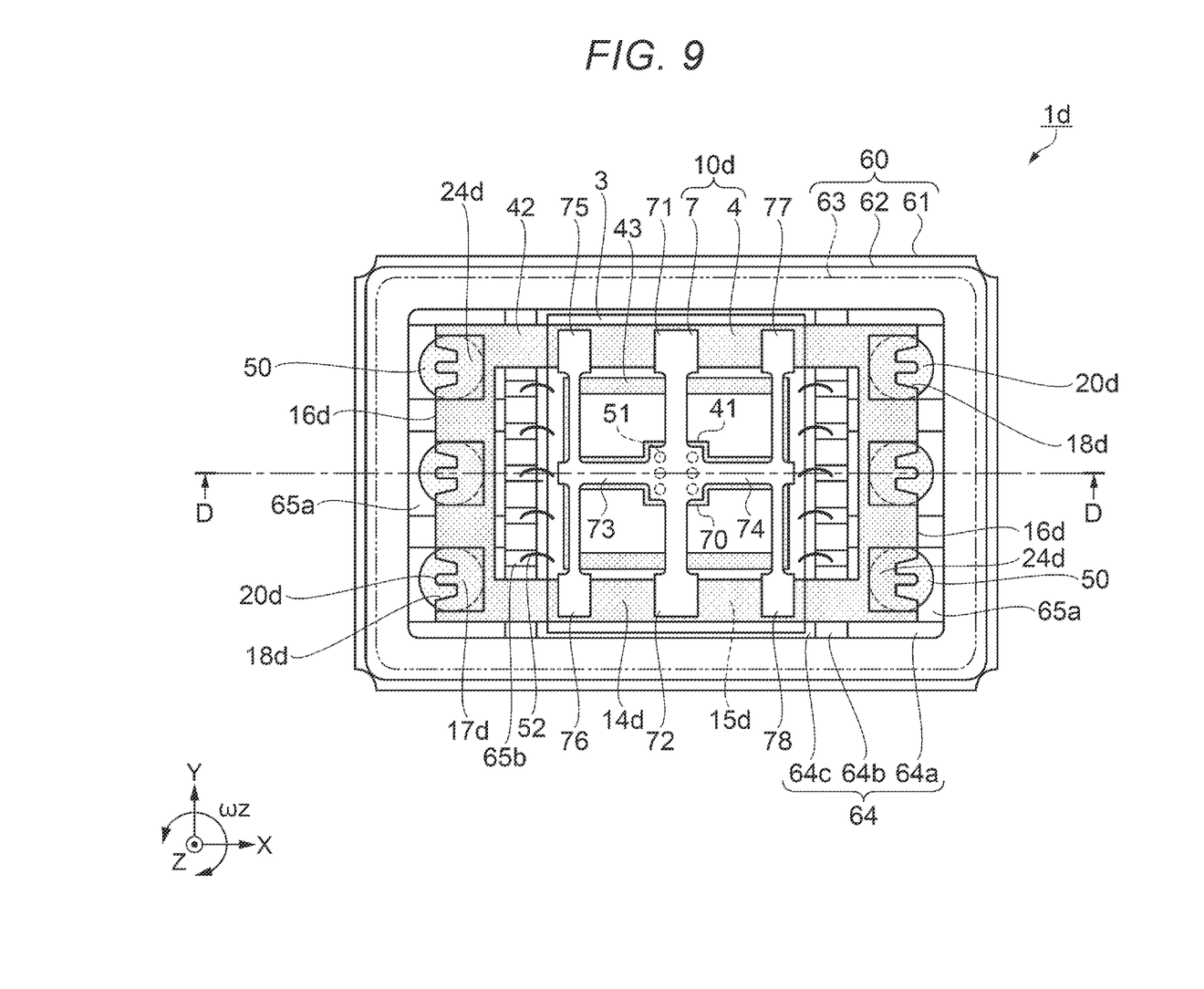
FIG. 9 is a plan view showing a schematic configuration of a vibrator device according to a fifth embodiment.

Then, a vibrator device 1d according to a fifth embodiment will be described with reference to FIG. 9, FIG. 10, and FIG. 11. It should be noted that in FIG. 9, FIG. 10, and FIG. 11, interconnections and electrodes provided to a support substrate 4 and a vibrator element 7 are omitted from the illustration.

Compared to the vibrator device 1 according to the first embodiment, the vibrator device 1d according to the present embodiment is substantially the same as the vibrator device 1 according to the first embodiment except the fact that structures of a vibrating body 10d and a package 60 are different. It should be noted that the description will be presented with a focus on the difference from the first embodiment described above, and the description of substantially the same issues will be omitted.

The vibrator device 1d according to the present embodiment is a physical quantity sensor for detecting angular velocity ωz defining the Z axis as the detection axis. As shown in FIG. 9 and FIG. 10, the vibrator device 1d has the package 60, and the vibrating body 10d and a circuit element 3 housed in the package 60. It should be noted that the vibrating body 10d includes the vibrator element 7 and the support substrate 4, wherein the vibrator element 7 is supported on the support substrate 4.

The package 60 has a base 61 provided with a recessed part 64 opening in an upper surface, and a lid 63 which is bonded to the upper surface of the base 61 via a bonding member 62 so as to close the opening of the recessed part 64. The recessed part 64 forms an internal space S inside the package 60, and the vibrating body 10d and the circuit element 3 are housed in the internal space S.

The internal space S is airtightly sealed, and is set in a reduced-pressure state, and more preferably a state approximate to a vacuum state. Thus, the viscosity resistance reduces and the vibration characteristics of the vibrator element 7 are improved.

Further, the recessed part 64 is constituted by a plurality of recessed parts 64a, 64b, and 64c arranged side by side in the Z direction, and has the recessed part 64a opening in the upper surface of the base 61, the recessed part 64b which opens in a bottom surface of the recessed part 64a and is smaller in opening width than the recessed part 64a, and the recessed part 64c which opens in a bottom surface of the recessed part 64b and is smaller in opening width than the recessed part 64b. Further, to the bottom surface of the recessed part 64a, there is fixed the support substrate 4 for the vibrating body 10d, and to the bottom surface of the recessed part 64c, there is fixed the circuit element 3.

Further, the bottom surface of the recessed part 64a is provided with a plurality of internal terminals 65a, the bottom surface of the recessed part 64b is provided with a plurality of internal terminals 65b, and the lower surface of the base 61 is provided with a plurality of external terminals 66. The internal terminals 65a, 65b and the external terminals 66 described above are electrically coupled to each other via interconnections not shown formed inside the base 61. Further, the internal terminals 65a are electrically coupled to interconnections not shown formed on the support substrate 4 and electrodes not shown formed on the vibrator element via the bonding materials 50, 51 having electrical conductivity, and the internal terminals 65b are electrically coupled to the circuit element 3 via bonding wires 52.

The circuit element 3 is fixed to the bottom surface of the recessed part 64c. The circuit element 3 includes a drive circuit and a detection circuit for driving the vibrator element 7 to detect the angular velocity wz applied to the vibrator element 7.

Figure 10:
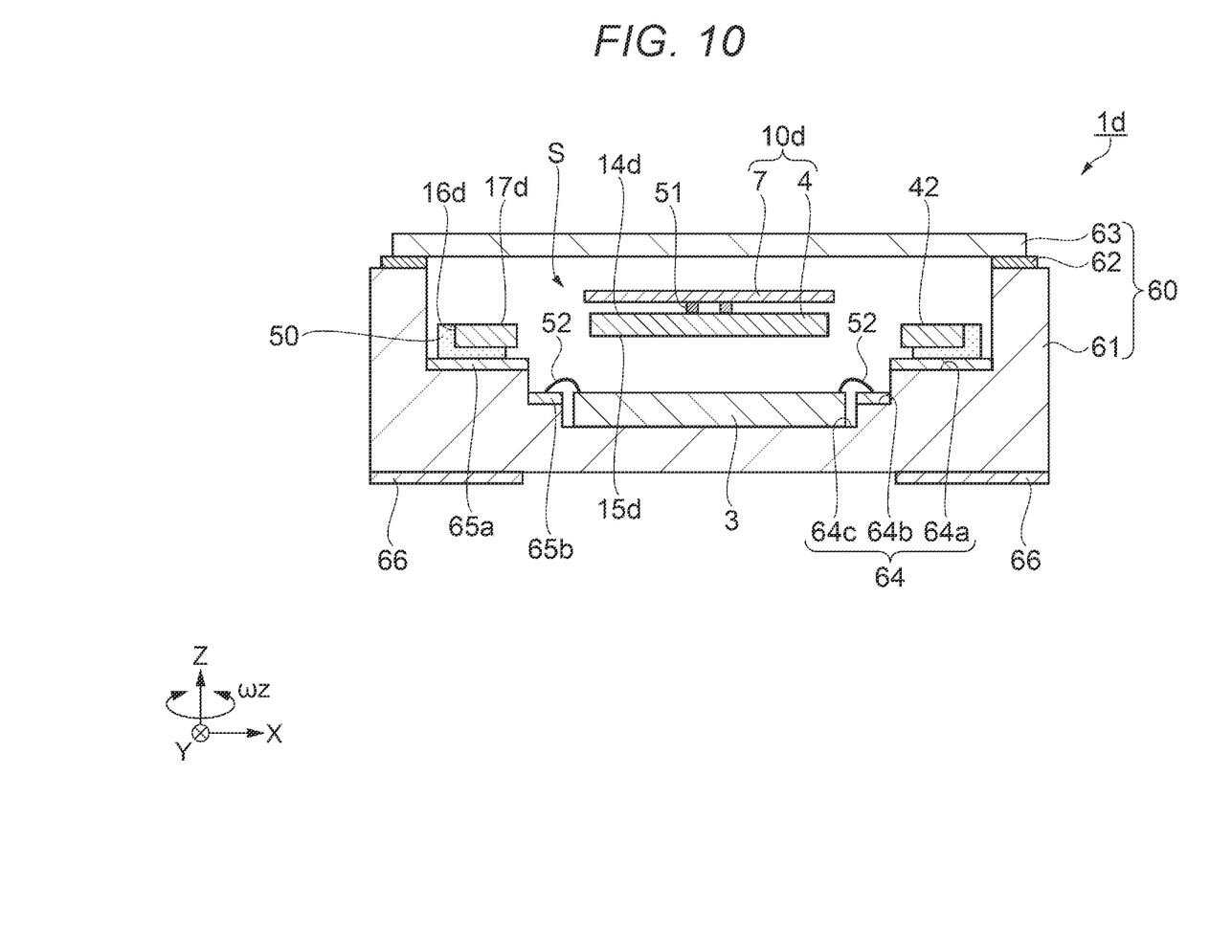
FIG. 10 is a cross-sectional view along a line D-D shown in FIG. 9.
Figure 11:
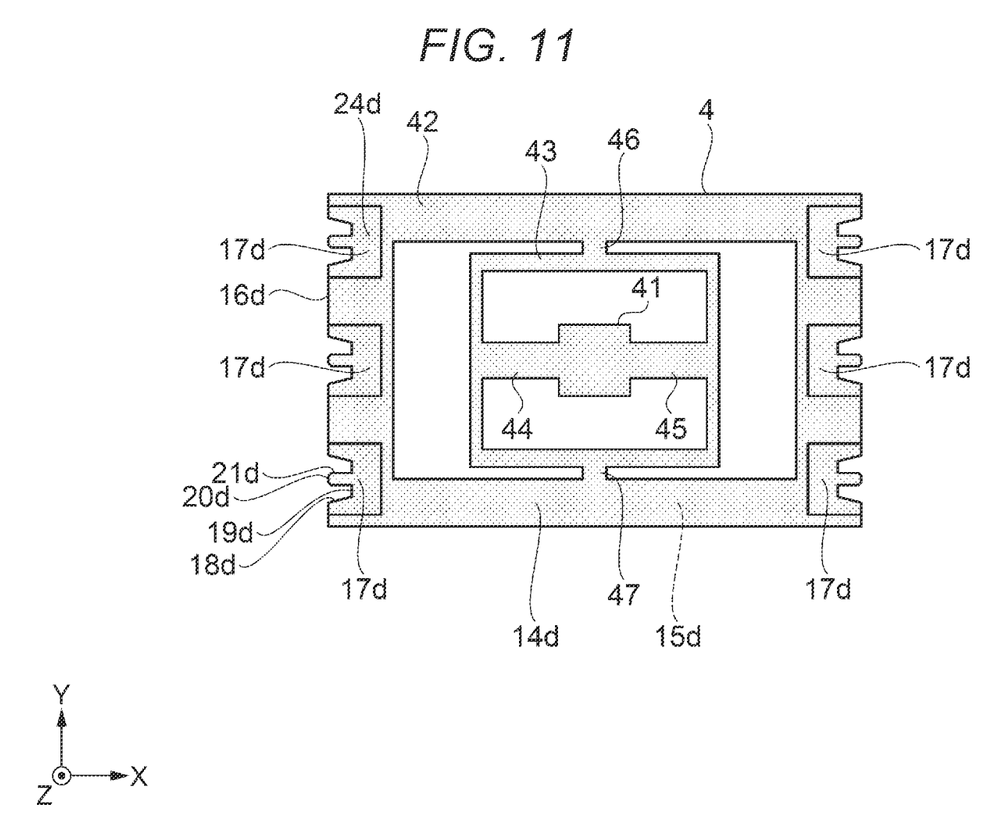
FIG. 11 is a plan view showing a support substrate shown in FIG. 9.

The vibrating body 10d includes the vibrator element 7 and the support substrate 4 disposed between the vibrator element 7 and the package 60, and supports the vibrator element 7 on the support substrate 4 via the bonding material 51 as shown in FIG. 10.

The vibrator element 7 is an angular velocity sensor element capable of detecting the angular velocity oz defining the Z axis as the detection axis as the physical quantity sensor element, and is formed of a Z-cut quartz crystal substrate or the like.

The vibrator element 7 has a base part 70, a pair of detection arms 71, 72, a pair of coupling arms 73, 74, a pair of drive arms 75, 76, and a pair of drive arms 77, 78, wherein the base part 70 is located in a central portion, the pair of detection arms 71, 72 extend toward both sides in the Y direction from the base part 70, the pair of coupling arms 73, 74 extend toward both sides in the X direction from the base part 70, the pair of drive arms 75, 76 extend toward both sides in the Y direction from a tip part of the coupling arm 73, and the pair of drive arms 77, 78 extend toward both sides in the Y direction from a tip part of the coupling arm 74.

The support substrate 4 is formed of a quartz crystal substrate the same in cutting angle as the vibrator element 7, and has obverse and reverse principal surfaces 14d, 15d and a side surface 16d connecting the obverse and reverse principal surfaces 14d, 15d to each other. Further, the support substrate 4 is what is broken off from the wafer to which a plurality of support substrates 4 is coupled via protrusions 20d described later. The support substrate 4 has a gimbal structure, and has an element mount part 41, a support part 42, a frame part 43, a pair of inner beam parts 44, 45, and a pair of outer beam parts 46, 47, wherein the vibrator element 7 is mounted on the element mount part 41, the support part 42 is located outside the element mount part 41, fixed to the base 61, and has a frame-like shape, the frame part 43 is located between the element mount part 41 and the support part 42, and has a frame-like shape surrounding the element mount part 41, the pair of inner beam parts 44, 45 extend toward both sides in the X direction from the element mount part 41 to couple the element mount part 41 and the frame part 43 to each other, and the pair of outer beam parts 46, 47 extend toward both sides in the Y direction from the frame part 43 to couple the frame part 43 and the support part 42 to each other in a plan view from the Z direction as shown in FIG. 9 and FIG. 11.

In the support part 42 of the support substrate 4, three coupling parts 17d are arranged along the Y direction at each of the ends in the X direction.

The coupling parts 17d are each provided with a recess 18d recessed toward the center of the support substrate 4, and a protrusion 20d protruding toward the X direction from a side surface 19d close to the center of the support substrate 4 in the recess 18d. The obverse and reverse principal surfaces 14d, 15d in each of the coupling parts 17d are provided with pad electrodes 24d electrically coupled to interconnections not shown formed on the support substrate 4.

The support substrate 4 is fixed on the recessed part 64a of the package 60 with the bonding material 50 having electrical conductivity in the six coupling parts 17d. Since the bonding material 50 has contact with a side surface 21d of the protrusion 20d in the recess 18d, namely the bonding material 50 penetrates between the recess 18d and the protrusion 20d, it is possible to more firmly fix the vibrating body 10d including the support substrate 4 in the package 60.

Further, the base part 70 of the vibrator element 7 is fixed on the element mount part 41 of the support substrate 4 via a plurality of bonding materials having electrical conductivity to thereby support the vibrator element 7 on the support substrate 4. It should be noted that the bonding material 51 is not particularly limited providing both of the electrical conductivity and the bonding property are provided, and there can be used a variety of metal bumps such as a gold bump, a silver bump, a copper bump, or a solder bump.

By adopting such a configuration to fix the coupling parts 17d inside the package 60 with the bonding material 50, there can be obtained substantially the same advantages as those of the vibrator device 1 according to the first embodiment.

6. Sixth Embodiment

Then, a vibrator device 1e according to a sixth embodiment will be described with reference to FIG. 12. It should be noted that in FIG. 12, interconnections and electrodes provided to the support substrate 4e are omitted from the illustration.

Compared to the vibrator device 1d according to the fifth embodiment, the vibrator device 1e according to the present embodiment is substantially the same as the vibrator device 1d according to the fifth embodiment except the fact that a structure of a support substrate 4e is different. It should be noted that the description will be presented with a focus on the difference from the fifth embodiment described above, and the description of substantially the same issues will be omitted.

Figure 12:
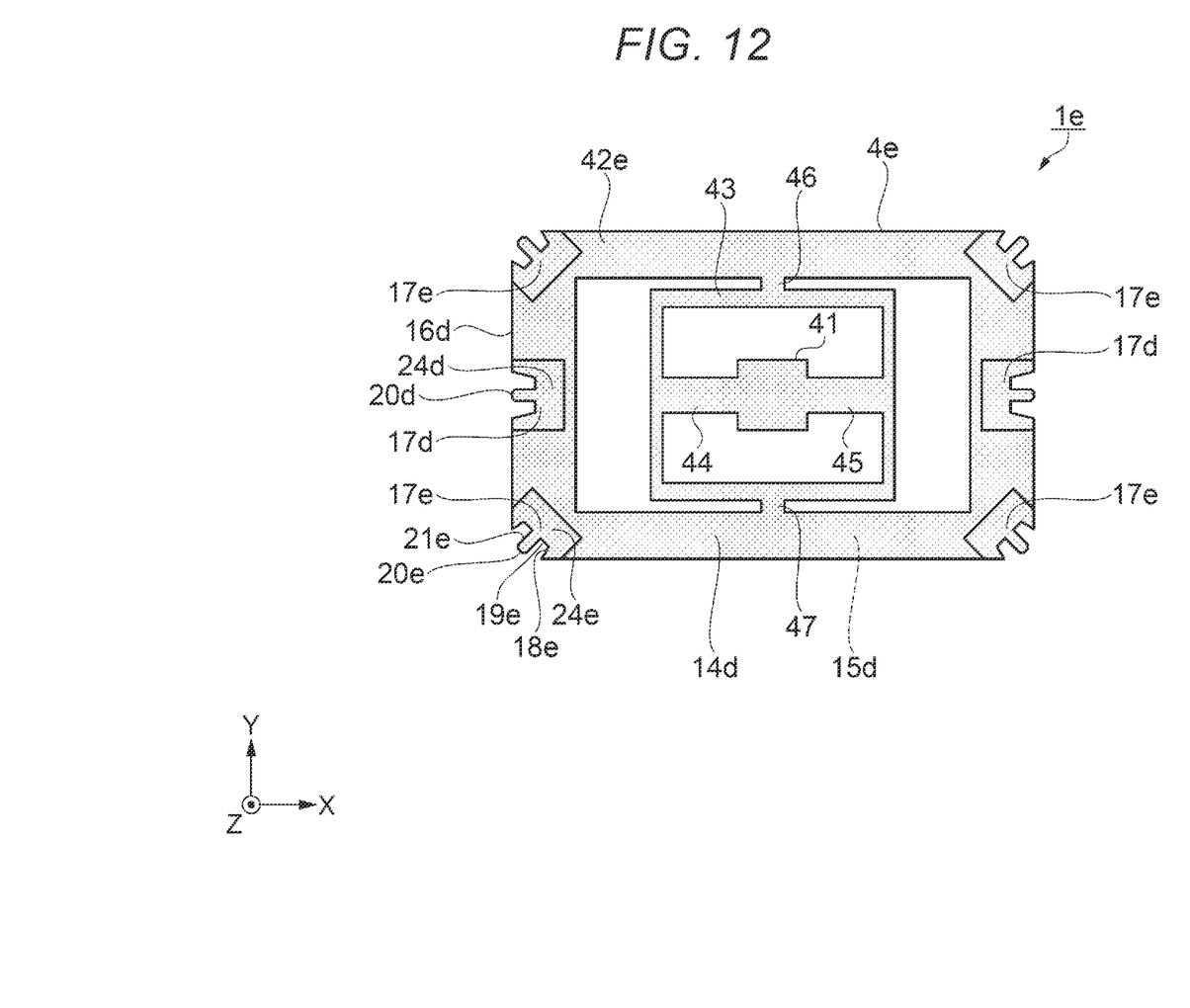
FIG. 12 is a plan view showing a support substrate of a vibrator device according to a sixth embodiment.

As shown in FIG. 12, in the vibrator device 1e according to the present embodiment, the direction in which a protrusion 20e provided to each of coupling parts 17e disposed on the four corners of a support part 42e of the support substrate 4e protrudes is different from the X direction as the first direction in which the protrusion 20d provided to each of the coupling parts 17d disposed at the center in the Y direction at the both ends in the X direction in the support part 42e protrudes. In other words, the coupling parts 17e disposed on the four corners of the support part 42e are each provided with a recess 18e recessed toward the center of the support substrate 4e, and the protrusion 20e protruding toward the direction different from the X direction from a side surface 19e close to the center of the support substrate 4e in the recess 18e. Therefore, it is possible to increase the resistance to impacts or the like from a variety of directions. Further, the obverse and reverse principal surfaces 14d, 15d in each of the coupling parts 17e are provided with pad electrodes 24e electrically coupled to interconnections not shown formed on the support substrate 4e.

By adopting such a configuration to fix the coupling parts 17e inside the package 60 with the bonding material 50, there can be obtained substantially the same advantages as those of the vibrator device 1d according to the fifth embodiment, and further, it is possible to obtain the vibrator device 1e excellent in impact resistance.

What is claimed is:

1. A vibrator device comprising:
a vibrating body having obverse and reverse principal surfaces and a side surface connecting the obverse and reverse principal surfaces to each other;
a package configured to house the vibrating body; and
a bonding material configured to fix the vibrating body to the package, wherein
the vibrating body has a coupling part including a recess recessed from the side surface toward a center of the principal surfaces, and a protrusion protruding from a side surface of the recess,
the protrusion is one of breaking-off parts with which a plurality of the vibrating bodies is broken off from a wafer to which the plurality of the vibrating bodies is coupled,
the bonding material has contact with a side surface of the protrusion in the recess, and
the protrusion includes a base extending from the side surface of the recess and having a constant width, and a tip which tapers inward from the base so as to become thinner as a distance from the side surface of the recess increases toward a tip end surface of the protrusion, the tip of the protrusion being thinner than the base.

2. The vibrator device according to claim 1, wherein
the coupling part has an electrode on at least one of the principal surfaces, and is electrically coupled to an interconnection at the package side via the bonding material.

3. The vibrator device according to claim 2, wherein
the electrode is also disposed on the side surface of the protrusion.

4. The vibrator device according to claim 1, wherein
the vibrating body includes a first coupling part and a second coupling part as the coupling part.

5. The vibrator device according to claim 4, wherein
the protrusion in each of the first coupling part and the second coupling part protrudes in a first direction.

6. The vibrator device according to claim 4, wherein
the protrusion in the first coupling part protrudes in a first direction, and
the protrusion in the second coupling part protrudes in a direction different from the first direction.

7. The vibrator device according to claim 1, wherein
the vibrating body is a vibrator element having a vibrating part and a fixation part, and the coupling part is provided to the fixation part.

8. The vibrator device according to claim 7, wherein
the fixation part has a base part and a support part coupled to the base part, and the coupling part is provided to the support part.

9. The vibrator device according to claim 1, wherein
the vibrating body includes a vibrator element and a support substrate disposed between the vibrator element and the package, and
the coupling part is formed in the support substrate.

10. The vibrator device according to claim 9, wherein
the support substrate is formed of quartz crystal.

11. A vibrator device comprising:
a vibrating body including a vibrator element and a support substrate, the support substrate having obverse and reverse principal surfaces and a side surface connecting the obverse and reverse principal surfaces to each other;
a package configured to house the vibrating body; and
a bonding material configured to fix the vibrating body to the package, wherein the support substrate of the vibrating body has a coupling part including a recess defined in the support substrate, the recess being recessed from the side surface of the support substrate toward a center of the principal surfaces, and a protrusion protruding from a side surface of the recess, the protrusion is one of breaking-off parts with which a plurality of the vibrating bodies is broken off from a wafer to which the plurality of the vibrating bodies is coupled, the bonding material has contact with a side surface of the protrusion in the recess, the support substrate is disposed between the vibrator element and the package, the coupling part has an electrode on at least one of the principal surfaces, and is electrically coupled to an interconnection at the package side via the bonding material, and the electrode is also disposed on the side surface of the protrusion.

12. A vibrator device comprising:

a vibrating body including a vibrator element and a support substrate, the support substrate having obverse and reverse principal surfaces and a side surface connecting the obverse and reverse principal surfaces to each other;

a package configured to house the vibrating body; and a bonding material configured to fix the vibrating body to the package, wherein the support substrate of the vibrating body has a coupling part including a recess defined in the support substrate, the recess being recessed from the side surface of the support substrate toward a center of the principal surfaces, and a protrusion protruding from a side surface of the recess, the protrusion is one of breaking-off parts with which a plurality of the vibrating bodies is broken off from a wafer to which the plurality of the vibrating bodies is coupled, the bonding material has contact with a side surface of the protrusion in the recess, the support substrate is disposed between the vibrator element and the package, the support substrate of the vibrating body includes a first coupling part and a second coupling part as the coupling part, the protrusion in the first coupling part protrudes in a first direction, and the protrusion in the second coupling part protrudes in a direction different from the first direction.

13. A vibrator device comprising:

a vibrating body including a vibrator element and a support substrate, the support substrate having obverse and reverse principal surfaces and a side surface connecting the obverse and reverse principal surfaces to each other;

a package configured to house the vibrating body; and a bonding material configured to fix the vibrating body to the package, wherein the support substrate of the vibrating body has a coupling part including a recess defined in the support substrate, the recess being recessed from the side surface of the support substrate toward a center of the principal surfaces, and a protrusion protruding from a side surface of the recess, the protrusion is one of breaking-off parts with which a plurality of the vibrating bodies is broken off from a wafer to which the plurality of the vibrating bodies is coupled, the bonding material has contact with a side surface of the protrusion in the recess, the support substrate is disposed between the vibrator element and the package, and in the protrusion, a tip side of the protrusion is made thinner than a base end close to the side surface of the recess.

14. The vibrator device according to claim 13, wherein the support substrate is formed of quartz crystal.

15. The vibrator device according to claim 13, wherein the coupling part has an electrode on at least one of the principal surfaces, and is electrically coupled to an interconnection at the package side via the bonding material.

16. The vibrator device according to claim 13, wherein the support substrate of the vibrating body includes a first coupling part and a second coupling part as the coupling part.

17. The vibrator device according to claim 16, wherein the protrusion in each of the first coupling part and the second coupling part protrudes in a first direction.

* * * * *